United States Patent [19]
Walker

[11] Patent Number: 4,823,392
[45] Date of Patent: Apr. 18, 1989

[54] COMPRESSOR

[75] Inventor: Michael Walker, Baltmannsweiler, Fed. Rep. of Germany

[73] Assignee: Standard Elektrik Lorenz Aktiengesellschaft, Stuttgart, Fed. Rep. of Germany

[21] Appl. No.: 13,704

[22] Filed: Feb. 12, 1987

[30] Foreign Application Priority Data

Feb. 15, 1986 [DE] Fed. Rep. of Germany ....... 3604832

[51] Int. Cl.$^4$ ............................................. H03G 7/00
[52] U.S. Cl. ...................................... 381/106; 333/14
[58] Field of Search ..................... 381/106, 72; 333/14

[56]  References Cited

U.S. PATENT DOCUMENTS 4,677,678  6/1987  McCutchen ........................... 381/72

Primary Examiner—Forester W. Isen
Attorney, Agent, or Firm—Spencer & Frank

[57] ABSTRACT

In a compressor for controlling the dynamic range of audio signals which comprises an operational amplifier and a gain-controlled amplifier connected in inverse parallel with the operational amplifier, the signal applied to a rectifier for producing the control signal for the gain-controlled amplifier is given an exponential waveform. This can be achieved by the use of two diodes connected in inverse parallel.

5 Claims, 3 Drawing Sheets

COMPRESSOR

BACKGROUND OF THE INVENTION

The present invention relates to a compressor for controlling the dynamic range of audio signals.

The circuit of such a compressor is shown in FIG. 14 of "Technische Information 821030" on the integrated circuit NE 572 of Valvo, Hamburg. This prior art compressor has a fixed compression ratio. Other, integral compression ratios can be achieved by connecting several compressors in series.

SUMMARY OF THE INVENTION

One object of the present invention is to provide a compressor which has a variable compression ratio and a limiting mode for high levels of the audio input signal.

By the use of few additional components, a compressor with a variable compression radio and simple control circuitry can be constructed. If an audio system containing such a compressor is used in a motor vehicle with ambient-noise-dependent gain control, an improvement in signal-to-ambient-noise ratio and overload-free operation are obtained. Even in the presence of very large audio signals, any disturbing increase in sound pressure is avoided.

BRIEF DESCRIPTION OF THE DRAWING

Embodiments of the invention will not be explained with reference to the accompanying drawings, in which.

DETAILED DESCRIPTION

Figure 1:
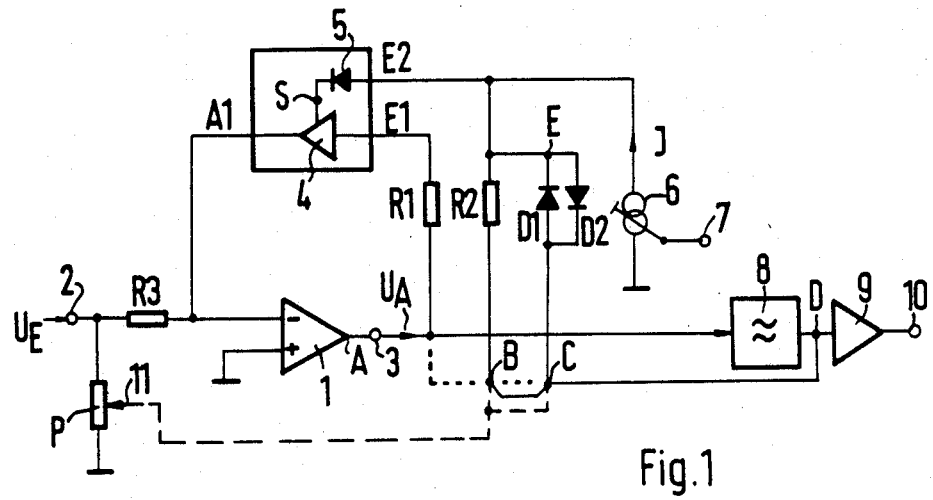
FIG. 1 is a block diagram of a portion of an audio system containing a compressor in accordance with the invention.

In the portion of an audio system shown in FIG. 1, a compressor contains an operational amplifier 1. The inverting input of the operational amplifier 1 is connected through a resistor R3 to the input terminal 2, at which the audio signal $U_E$ is applied. The noninverting input of the operational amplifier 1 is grounded. The output A of the operational amplifier 1 is connected to the output terminal 3, which provides the signal $U_A$. The output terminal 3 is followed by a filter 8, whose output is coupled via point D to the input of a power amplifier 9. The terminal 10 delivers the amplified audio signal, which can be fed to a loudspeaker (not shown).

A gain-controlled amplifier 4 is connected in inverse parallel with the operational amplifier 1. Its input E1 is ocnnected to the output terminal 3 at the output A of the operational amplifier 1 through a resistor R1. The output A1 of the amplifier 4 is connected to the inverting input of the operational amplifier 1. The gain of the amplifier 4 is controlled by a level produced by a full-wave rectifier 5. To this end, the full-wave rectifier 5 has its DC voltage output connected to the control input S, and its AC voltage input E2 is connected to points B and C via a special circuit and to an adjustable current source 6. The combination of the gain-controlled amplifier 4 and the rectifier 5 is available as an integrated circuit.

The gain-controlled amplifier 4 may be replaced by a variable resistance consisting, for example, of an resistor in series with the source-drain path of a field-effect transistor to whose gate the level from the full-wave rectifier is applied.

The current source 6 supplies an adjustable current I and has one end grounded. It has a terminal 7 to which a signal adjusting the magnitude of the current I can be applied.

A resistor R2 is inserted between the input E2 and the point B, and two diodes D1, D2 are connected in inverse parallel between the input E2 and the point C. The junction point of the diodes D1, D2 on the side of the input E2 is designated E. The points B and C may be connected to the point D at the output of the filter 8, as indicated by the solid line, or to the output terminal 3 at the output of the operational amplifier 1, as indicated by the dotted line, or to the sliding contact 11 of a potentiometer P connected to the input terminal 2, as indicated by the dashed line. The points B and C need not be connected in common to the same points but may also be connected to a different point each.

If the point B is connected to the output terminal 3, the compression ratio is 2:1. If the point B is connected to the sliding contact 11, an adjustable compression is obtained which, when at its maximum, prevents any appreciable level changes in the signal $U_A$. If the point B is connected to the point D, the compression depends on the output voltage of the filter, the filter curve being compressed with increasing input-signal level. In this manner, automatic boosting of low-pitched tones can be achieved in the presence of small signals.

Figure 2:
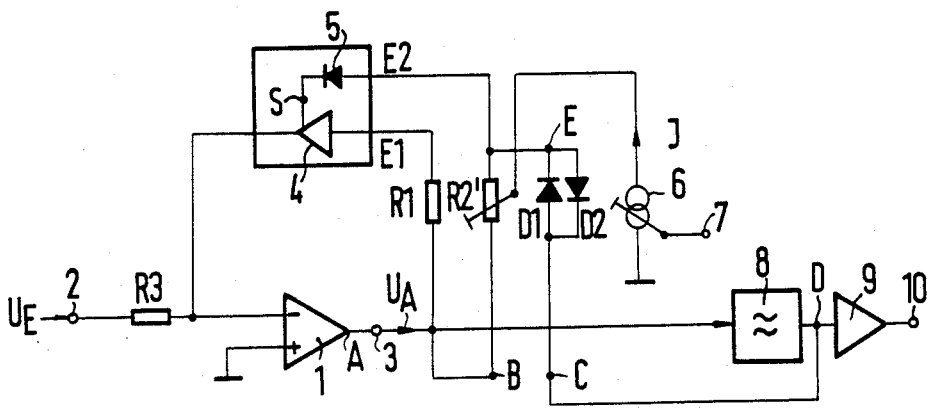
FIG. 2 is a block diagram of a preferred embodiment of the compressor.

In FIG. 2, in a preferred embodiment of the compressor, the point B is connected to the output terminal 3, and the point C to the point D.

The signals applied at the inputs E1 and E2 are multiplied together, so that any change in the level of the audio signal $U_E$ at the input terminal 2 results in a change in the level of the signal $U_A$ depending on the root of the value of the change in input voltage level. This applies to signal values at the point D which are below the threshold values of the diodes D1 and D2; at these signal values, only the resistor R2 is effective. In the presence of larger signals at the point D, the curved portions of the characteristics of the diodes D1 and D2 cause the signal applied to the rectifier 5 through the input E2 to assume an exponential waveform. This means that disproportionate compression occurs for increasing signal levels at the point D. At a sufficient steepness of the diode characteristics, in the presence of large audio signals, the compressor changes to the limiting mode. In this mode, a change in the level of the audio signal $U_E$ at the input terminal 2 is followed by hardly any change in the level of the signal $U_A$ at the output terminal 3.

By means of the current I from the adjustable current source 6, the limit at which the compressor changes to the compressing mode can be fixed. All changes going beyond this limit are compressed. All changes below this limit are transferred proportionally. If the resistor R2 is replaced by a variable resistor R2', and the current source 6 is connected to the sliding contact of this resistor, the change to the compressing mode is made continuous.

Figure 3:
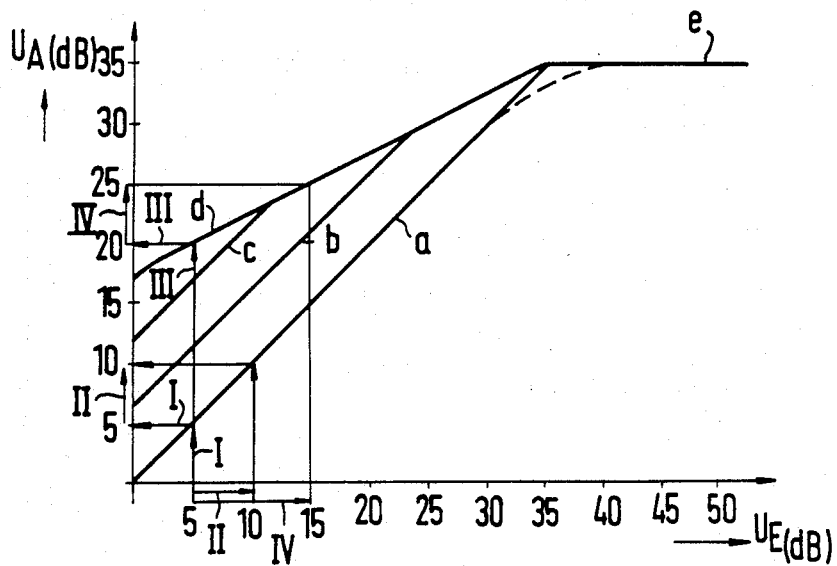
FIG. 3 is a graph serving to explain the compression ratio.

In FIG. 3, the signal $U_A$ is plotted against the audio signal $U_E$ to illustrate the compression. Depending on the current I from the current source 6 fed into the input E2, a mode of operation is obtained for the compressor which extends from no compression to a fixed compression. The straight line a represents the setting of the compressor to no compression, and the straight line d to a fixed compression. The straight lines b and c represent intermediate values. It should be noted that a great number of straight lines are possible; only the straight lines a to d are shown for the sake of clarity.

The mode of operation of the compressor according to the straight line a is achieved by feeding the maximum current I into the input E2, while the mode according to the straight line d is obtained by feeding in the minimum current I. All straight lines a to d pass into the horizontal straight line e, which indicates that, in this region, the compressor limits the signal $U_A$ to a fixed value, in FIG. 3 to 35 dB. By choosing a suitable value for the resistor R2, the break at the point where the straight lines a to d pass into the straight line e can be replaced by a smooth transition, as is indicated in FIG. 3 by the dashed line between the straight lines a and e.

If the audio system with the compressor described is used in a motor vehicle, a signal can be applied to the terminal 7 which depends on the noise level in or the speed of the motor vehicle or on any other value corresponding to the noise level. At a low noise level in the motor vehicle, the current source 6 feeds the maximum current I into the input E2; at a high noise level, it feeds in the minimum current I. It follows that, at low noise levels, the amplifier 1 operates without gain, straight line a, up to the limiting mode, straight line e. At increasing noise levels, the amplifier 1 works in accordance with the straight lines b to d, i.e., the amplification of small signals increases more than the amplification of large signals, which means that the compressoin of the dynamic range of the signal $U_A$ increases. This will now be explained with the aid of two examples.

At low noise levels, the levels of the audio signal $U_E$ appear unchanged as the levels of the signal $U_A$ in accordance with the straight line a. If the audio signal $U_E$ has a level of, e.g., 5 dB, the signal $U_A$ has a level of 5 dB, too, see the arrows I in FIG. 3. Accordingly, a change in the level of the audio signal $U_E$ from, e.g., 5 to 10 dB is reproduced as a change in the level of the signal $U_A$ from 5 to 10 dB, see arrows II. For audio signals $U_E$ with a level exceeding 35 dB, the signal $U_A$ is limited to this value. In the event of a change in the level of the audio signal $U_E$ from, e.g., 35 to 40 dB, the signal $U_A$ is limited to the 35-dB level.

In high ambient-noise conditions, the amplifier 1 operates in accordance with the straight line d, which means that the 5-dB audio signal $U_E$ is amplified and is reproduced as a signal $U_A$ with a level of 20 dB, see arrows III. A change in level of the audio signal $U_E$ by 10 dB, from 5 to 15 dB, results in a level of 20 to 25 dB in the signal $U_A$, i.e., the level change is compressed to 5 dB, see arrows IV. In this case, too, the signal $U_A$ is limited to 35 dB, when the level of the audio signal $U_E$ reaches 35 dB.

Figure 4:
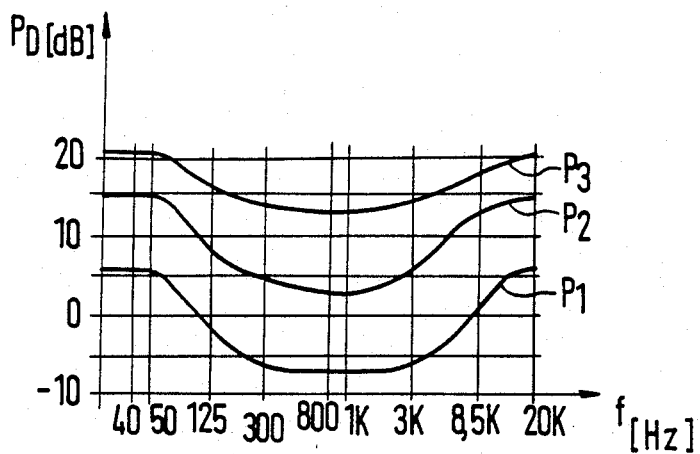
FIG. 4 shows the level at the output of a filter following the compressor.

In FIG. 4, the level $P_D$ at the output of the filter 8 of FIG. 2 is plotted against frequency. In this example, the filter 8 is a bass- and treble-boosting design. In a first case, the noise level is assumed to be low, and the current source 6 feeds the maximum current I into the input E2. At the point D at the output of the filter 8, the curve P1 is then measurable. The curve P2 above the curve P1 is obtained at a slightly higher noise level. At high noise levels, the curve p3 is measurable at the point D, and a compression of the level $P_D$ is apparent. This circuit additionally provides automatic bass-boosting at low levels P. At a frequency of 50 Hz, the reduction from the curve P3 to the curve P1 is only 15 dB, while at a frequency of 1 kHz, the reduction is 20 dB, i.e., referred to the frequency of 1 kHz, the frequency of 50 kHz is increased by 5 dB.

Figure 5:
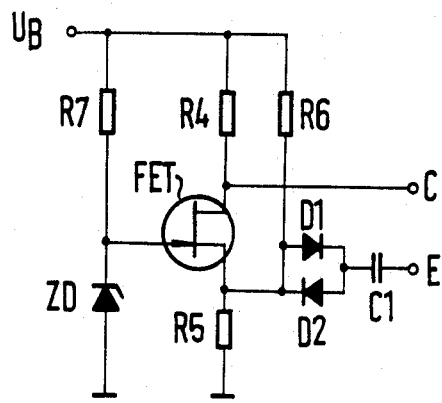
FIGS. 5 and 6. show further circuits usuable between points E and C.

In motor vehicles, the battery voltage and, hence, the supply voltage for the audio system are subject to very wide variations. FIG. 5 shows a circuit which is added to the diodes D1, D2 and allows for the varying supply voltage. The drain terminal of a field-effect transistor FET is connected to the supply voltage $U_B$ through a resistor R4, and the source terminal is grounded through a resistor R5 and connected to the supply voltage $U_B$ through a resistor R6. Connected to the gate terminal are a resistor R7 having its other end connected to the supply voltage $U_B$, and a grounded zener diode ZD. By way of the diodes D1, D2, which are connected in inverse parallel, and a capacitor C1, the source terminal is connected to the point E, while the point C is connected to the drain terminal. At a supply voltage of, e.g., 10 V, the limiting action of the compressor starts at 8 $V_{ss}$ at the terminal 10, while at a supply voltage of 14.4 V, limiting starts only at 12 $V_{ss}$ at the terminal 10. this permits distortion-free reproduction at the maximum possible output power.

Figure 6:
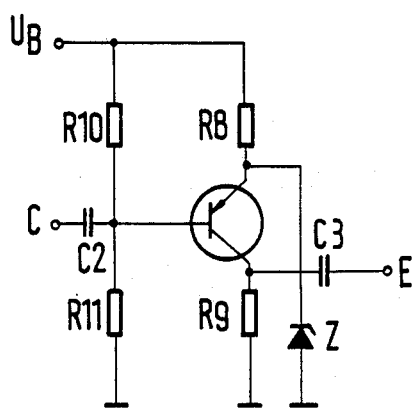

FIG. 6 shows a circuit replacing the diodes D1, D2. The emitter of a PNP transistor is connected to the supply voltage $U_B$ through a resistor R8 and to ground through a zener diode Z, and the collector is grounded through a resistor R9. The base is connected to a voltage divider R10, R11 and, through a capacitor C2, to the point C. The collector is connected to the point E through a capacitor C3. In this circuit, the base-emitter path causes the rexponentional waveform of the signal applied to the rectifier 5, and as a result, only one half wave of the signal appearing at the point C is utilized. But with this circuit, too, the varying supply voltage $U_B$ is taken into account.

What is claimed is:

1. A compressor for controlling the dynamic range of audio signals comprising:
    an operational amplifier;
    a gain-controlled amplifier connected in inverse parallel with said operational amplifier and having a control input;
    a rectifier connected to said control input and receiving an exponential waveform only from a given level of an audio signal applied to the input of said operational amplifier, and wherein an adjustable current is impressed on said rectifier;
    a PNP transistor having its base-emitter path connected to said rectifier, a base voltage divider being connected to the base of said transistor;
    a zener diode connecting the emitter of said transistor to ground; and
    a resistor connected to said rectifier.

2. A compressor for controlling the dynamic range of audio signals comprising:
    an operational amplifier;
    a gain-controled amplifier connected in inverse parallel with said operational amplifier and having a control input;

a rectifier connected to said control input and receiving an exponential waveform only from a given level of an audio signal applied to the input of said operational amplifier, and wherein an adjustable current is impressed on said rectifier;

first and second diodes connected in inverse parallel and connected to said rectifier and a resistor connected to said recitifier; and a field effect transistor having its source-drain path in series with said first and second diodes and said rectifier, and having a gate terminal connected to a supply voltage through a second resistor and to ground through a zener diode.

3. A compressor for controlling the dynamic range of audio signals comprising:

an operational amplifier;

a gain-controlled amplifier connected in inverse parallel with said operational amplifier and having a control input;

a rectifier connected to said control input and receiving an exponential waveform only from a given level of an audio signal applied to the input of said operational amplifier, and wherein an adjustable current is impressed on said recitifer; and first and second diodes connected in inverse parallel and connected to said rectifier and a resistor connected to said rectifier; said first and second diodes and said resistor being connected to the output of said operational amplifier.

4. A compressor for controlling the dynamic range of audio signals comprising:

an operational amplifier;

a gain-controlled amplifier connected in inverse parallel with said operational amplifier and having a control input;

a rectifier connected to said control input and receiving an exponential waveform only from a given level of an audio signal applied to the input of said operational amplifier, and wherein an adjustable current is impressed on said rectifier;

first and second diodes connected in inverse parallel and connected to said rectifier and a resistor connected to said rectifier; and a potentiometer for connecting said first and second diodes and said resistor to the input terminal for the audio signal.

5. A compressor for controlling the dynamic range of audio signals comprising:

an operational amplifier;

a gain-controlled amplifier connected in inverse parallel with said operational amplifier and having a control input;

a rectifier connected to said control input and receiving an expoential waveform only from a given level of an audio signal applied to the input of said operational amplifier, and wherein an adjustable current is impressed on said rectifier;

first and second diodes connected in inverse parallel and connected to said rectifier and a variable resistor having a sliding contact and being connected to said rectifier;

a filter following said compressor;

said first and second diode being connected to the output of said filter said resistor being connected to the output of said operational amplifier; and a current source for the adjustable current connected to said sliding contact of said resistor.

* * * * *